United States Patent
Ishikawa et al.

(10) Patent No.: US 7,431,218 B2
(45) Date of Patent: Oct. 7, 2008

(54) RFID TAG, MODULE COMPONENT, AND RFID TAG FABRICATION METHOD

(75) Inventors: Naoki Ishikawa, Kawasaki (JP); Shunji Baba, Kawasaki (JP); Hidehiko Kira, Kawasaki (JP); Hiroshi Kobayashi, Kawasaki (JP); Shunichi Kikuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/188,346

(22) Filed: Jul. 25, 2005

(65) Prior Publication Data

US 2006/0208094 A1     Sep. 21, 2006

(30) Foreign Application Priority Data

Mar. 17, 2005    (JP)   ............................ 2005-077108

(51) Int. Cl.
     *G06K 19/06*      (2006.01)
(52) U.S. Cl. ........................ 235/492; 235/487
(58) Field of Classification Search ................. 235/492, 235/487; 343/718
See application file for complete search history.

(56) References Cited

U.S. PATENT DOCUMENTS

| | | | |
|---|---|---|---|
| 6,271,793 B1 * | 8/2001 | Brady et al. | 343/700 MS |
| 6,357,106 B1 * | 3/2002 | Oku et al. | 29/602.1 |
| 6,816,380 B2 | 11/2004 | Credelle et al. | |
| 6,891,110 B1 | 5/2005 | Pennaz et al. | |
| 2005/0270752 A1 * | 12/2005 | Credelle et al. | 361/736 |
| 2006/0152306 A1 * | 7/2006 | Ito et al. | 333/219.1 |

FOREIGN PATENT DOCUMENTS

| | | |
|---|---|---|
| JP | 2000-200332 | 7/2000 |
| JP | 2000-311226 | 11/2000 |
| JP | 2000-311233 | 11/2000 |
| JP | 2001-351082 | 12/2001 |

OTHER PUBLICATIONS

Chinese Office Action issued Jul. 6, 2007, from the corresponding Chinese Application.
Taiwanese Office Action dated Apr. 24, 2008, from the corresponding Taiwanese Application.

* cited by examiner

*Primary Examiner*—Lisa M Caputo
(74) *Attorney, Agent, or Firm*—Katten Muchin Rosenman LLP

(57) ABSTRACT

An RFID tag including a first part which has a first base and a communication antenna formed on the first base by use of a paste of resin material mixed with metallic filler; and a second part disposed on the first part, which has a second base, a metallic patch disposed on the second base and electrically connected to the antenna on the first part, and a circuit chip connected onto the metallic patch via a bump, the circuit chip performing radio communication via the antenna.

5 Claims, 11 Drawing Sheets

RFID TAG, MODULE COMPONENT, AND RFID TAG FABRICATION METHOD

BACKGROUND OF THE INVENTION

1. Field of the Invention

The present invention relates to an RFID (Radio Frequency Identification) tag performing non-contact information exchange with outside apparatuses, an electronic component used to fabricate the RFID tag, and an RFID tag fabrication method of fabricating the RFID tag. It is noted that, among those skilled in the technical field of the present invention, "RFID tag", as used in the present specification, is sometimes referred to as "RFID tag inlay", which means an internal constituent member (inlay) for "RFID tag". Alternatively, this "RFID tag" is sometimes also referred to as "wireless IC tag". This "RFID tag" also includes non-contact IC cards.

2. Description of the Related Art

In recent years, various types of RFID tags have been proposed which perform, by radio wave, non-contact information exchange with outside apparatuses represented by a reader/writer. As one type of this RFID tag, an RFID tag has been proposed which includes an antenna pattern for radio communication and an IC chip mounted on the base sheet made of plastic, paper or the like. An application for the RFID tag of this type has been devised in which the RFID tag is attached to an article to exchange the information about the article with outside apparatuses, whereby the article is identified.

FIG. 1 is a front view (A) and a side sectional view (B) showing an exemplary RFID tag.

Referring to FIG. 1, an RFID tag 1 includes an antenna 12 disposed on a base 13 made of a sheet-like PET film or the like, an IC chip 11 connected to the antenna 12 via a bump 16, and a cover sheet 14 attached to the base 13 with an adhesive 15 so as to cover the antenna 12 and IC chip 11.

The IC chip 11 constituting the RFID tag 1 can perform radio communication with outside apparatuses via the antenna 12 to exchange information.

With this RFID tag, a wide range of applications including the foregoing one has been devised. However, fabrication cost poses one of the major problems in using this RFID tag in various applications. Thus various attempts have been made to reduce the fabrication cost.

As an attempt to reduce the fabrication cost, there has been devised a technique of forming the antenna by use of printing technology by using a paste of resin material, such as epoxy, mixed with metallic filler (typically, Ag) so as to have conductivity (for example, refer to Japanese Patent Laid-Open Nos. 2000-311226 (paragraph number [0066]), 2000-200332 (paragraph numbers [0027] and [0028]), and 2001-351082 (paragraph number [0021]). Conventionally, as a material to form an antenna, a metallic thin material such as Cu, Al, Au, or the like is used. If the above-mentioned paste material to form an antenna can be used, the fabrication cost of RFID tag can be greatly reduced.

FIG. 1 is a top view (A) and a side view (B) showing an exemplary typical configuration of the RFID tag. In the top view, part of the constituent elements is omitted; in the side view, the internal structure seen through from the side face of the RFID tag is illustrated. Hereinafter, all diagrams referred to as "top view" or "side view" in the present specification are similar to the above described diagrams.

The RFID tag 1 having a typical structure includes the antenna pattern 12 disposed on the base sheet 13 made of a PET material or the like, the IC chip 11 connected to the antenna pattern 12 via the bump 16 (metallic protrusion), the cover sheet 14 attached to the base sheet 13 with the adhesive 15 so as to cover the antenna pattern 12 and IC chip 11.

In fabricating the RFID tag 1 shown in FIG. 1, the IC chip 11 is connected, via the bump 16 formed on the IC chip 11, onto the antenna pattern 12 formed on the surface of the base sheet 13. When the antenna pattern 12 is formed by printing a paste material, the following problem may arise in performing the connection.

FIG. 2 is a conceptual diagram that explains the problem which arises when a paste is used as the antenna material.

To fabricate the RFID tag, firstly the antenna pattern 12 made of a paste material is formed on the base sheet 13 of PET material by use of a printing technique (part (A)). Subsequently, the IC chip 11 having the bump 16 formed on an electrode 111 is arranged on the base sheet 13 having formed thereon the antenna pattern 12, with the bump 16 oriented toward the base sheet 13 side (part (B)). Then, when the IC chip 11 is pressed from above in the drawing by a jig (not shown), the bump 16 provides suppress strength to the antenna pattern 12, thereby connecting the IC chip 11 to the antenna pattern 12.

At this time, a projection 12a of the paste material constituting the antenna pattern 12 is formed around the bump 16 by the suppress strength applied to the antenna pattern 12 by the bump 16. Consequently, an insulating distance required between the IC chip 11 and antenna pattern 12 can not be secured. Thus, performances achieved by the RFID tag (hereinafter, referred to as "tag performance"), such as radio communication performance, will change, causing the variations of tag performance observed when many RFID tags are fabricated.

Apart from RFID tags, it is a common practice for various types of IC chips to be mounted on a circuit board. In this case, since many bumps are formed in the IC chip, even if a paste material is employed as the wiring material on the circuit board, suppress strength per bump is small, so the projection of the paste material hardly poses any problem.

In contrast, with the RFID tag, the number of bumps used to connect the IC chip to the antenna pattern is on the order of 2 to 4 per IC chip; therefore, the suppress strength per bump is significantly large, causing the problem of the paste material being projected as described above. To reduce this suppress strength, the suppress strength applied by a device used to dispose the IC chip onto the base must be considerably reduced relative to when an ordinary IC chip having formed therein many bumps is disposed. However, with the adhesive sandwiched between the base and IC chip, it is difficult to perform rapid and highly reliable connection while considerably reducing the suppress strength.

To address the above problem, the present invention provides an RFID tag in which a paste is employed as the antenna material and at the same time, the problem of the change of tag performance caused by the above mentioned projection is avoided, a module component for use in the RFID tag, and a fabrication method of the RFID tag.

SUMMARY OF THE INVENTION

The present invention has been made in view of the above circumstances and provides an RFID tag, a module component, and an RFID tag fabrication method.

An RFID tag according to the present invention includes: a first part which has a first base and a communication antenna formed on the first base by use of a paste of resin material mixed with metallic filler; and a second part disposed on the first part, which has a second base, a metallic patch disposed on the second base and electrically connected to the antenna on the first part, and a circuit chip connected onto the metallic patch via a bump, the circuit chip performing radio communication via the antenna.

With the RFID tag according to the present invention, the circuit chip is connected to the metallic patch of the second part; the metallic patch is electrically connected to the antenna made of a paste. Accordingly, the circuit chip is connected to the antenna by two steps, so the bump is pressed against the metallic patch rather than against the antenna. Consequently, the above mentioned projection of paste material can be avoided; thus the problem of the change of tag performance can also be avoided. In addition, since the metallic patch is arranged in the second part, by fabricating the second part alone in a process separate from that of the first part, etching etc. can be performed efficiently, thus contributing to cost reduction.

With the RFID tag according to the present invention, in the second part, the metallic patch is preferably connected to the antenna of the first part via a paste of resin material mixed with metallic filler.

While various techniques of electrically connecting the metallic patch and antenna are possible, a structure based on connecting via a paste similar to the antenna itself can be fabricated easily and at low cost.

A module component according to the present invention, which constitutes an RFID, is mounted on an antenna component which has a first base and a communication antenna formed on the first base by use of a paste of resin material mixed with metallic filler. The module component includes a second base, a metallic patch disposed on the second base to be electrically connected to the antenna on the antenna component, and a circuit chip connected onto the metallic patch via a bump, the circuit chip performing radio communication via the antenna.

The module component of the present invention corresponds to the second part of the RFID tag according to the present invention. When the module component of the present invention is used, then even when a paste is employed as the antenna material, the above mentioned projection of paste material can be avoided; thus the problem of the change of tag performance can also be avoided. Also, by fabricating the module component of the present invention in a process separate from that of the antenna component corresponding to the above mentioned first part, etching etc. can be performed efficiently, thus contributing to the cost reduction of the RFID tag.

An RFID tag fabrication method according to the present invention fabricates an RFID tag including a communication antenna and a circuit chip performing radio communication via the antenna. The RFID tag fabrication method according to the present invention includes the steps of: forming a first part by disposing the antenna on a first base by use of a paste of resin material mixed with metallic filler; forming a second part by disposing a metallic patch on a second base and connecting the circuit chip onto the metallic patch via a bump; and disposing the second part on the first part to connect electrically the metallic patch on the second part to the antenna on the first part.

With this RFID tag fabrication method of the present invention, the above mentioned projection of paste material can be avoided; thus the problem of the change of tag performance can also be avoided. In addition, with this RFID tag fabrication method, the first part provided with the antenna made of a paste is formed in a process separate from that of the second part provided with the metallic patch. Consequently, each of the first part and second part can be formed efficiently, thus contributing to the cost reduction of the RFID tag.

In the above step of forming the second part of the RFID tag fabrication method according to the present invention, the second part is preferably formed by disposing the metallic patch on a base material having a width corresponding to multiple pieces of the second part, connecting the circuit chip onto the metallic patch via the bump, and then cutting the base material into multiple second bases.

With the RFID tag fabrication method having this step of forming the second part, the second part can be efficiently formed, further contributing to the cost reduction of the RFID tag.

As described above, with the present invention, while a paste is employed as the antenna material, the problem of the change of tag performance caused by the projection of the paste material can be avoided.

BRIEF DESCRIPTION OF THE DRAWINGS

Preferred embodiments of the present invention will be described in detail based on the following figures, wherein.

DETAILED DESCRIPTION OF THE INVENTION

An embodiment of the present invention will be described below with reference to the accompanying figures.

Figure 3:
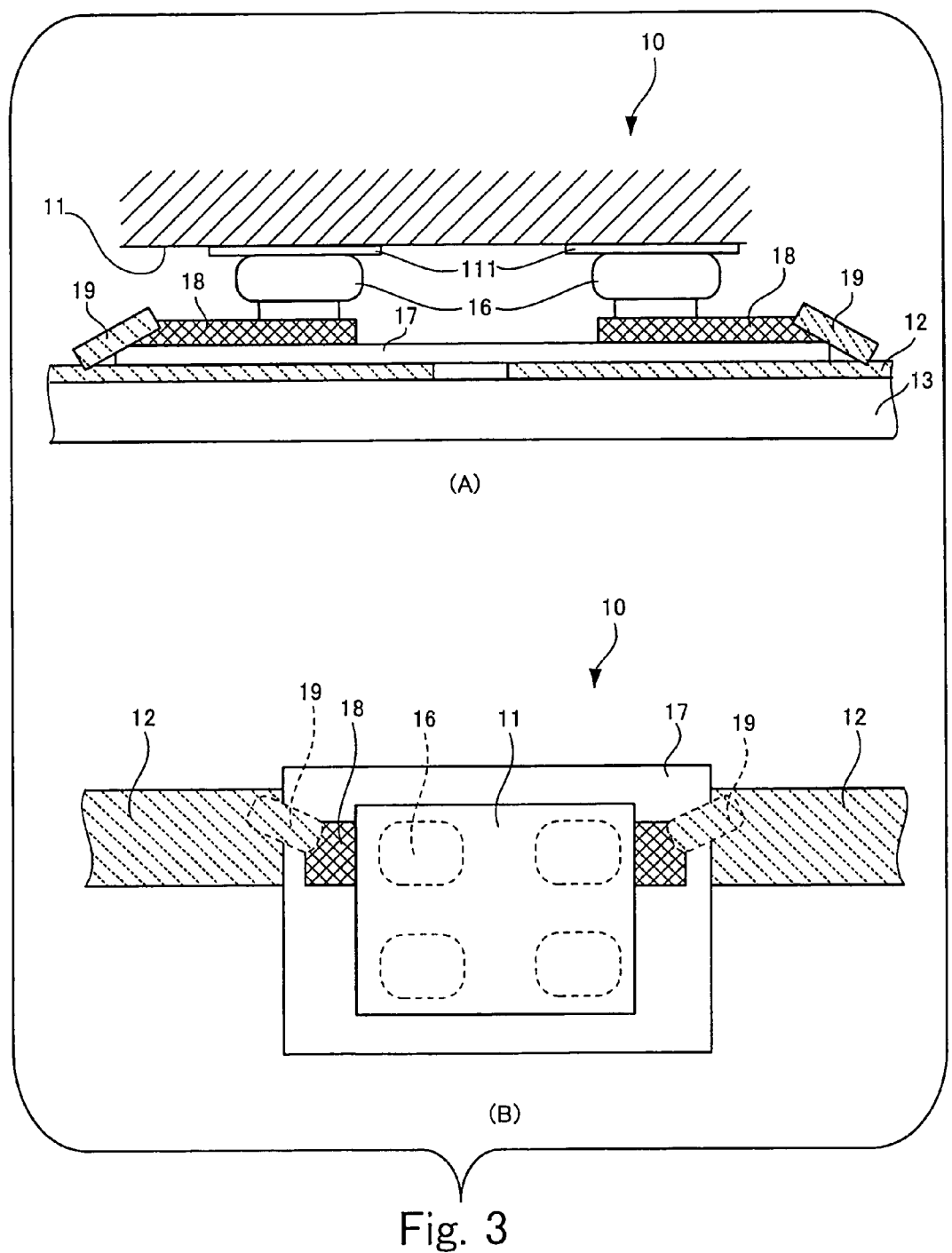
FIG. 3 is a side view (A) and a top view (B) showing an embodiment of the present invention.

FIG. 3 is a side view (A) and a top view (B) showing an embodiment of the present invention.

Figure 1:
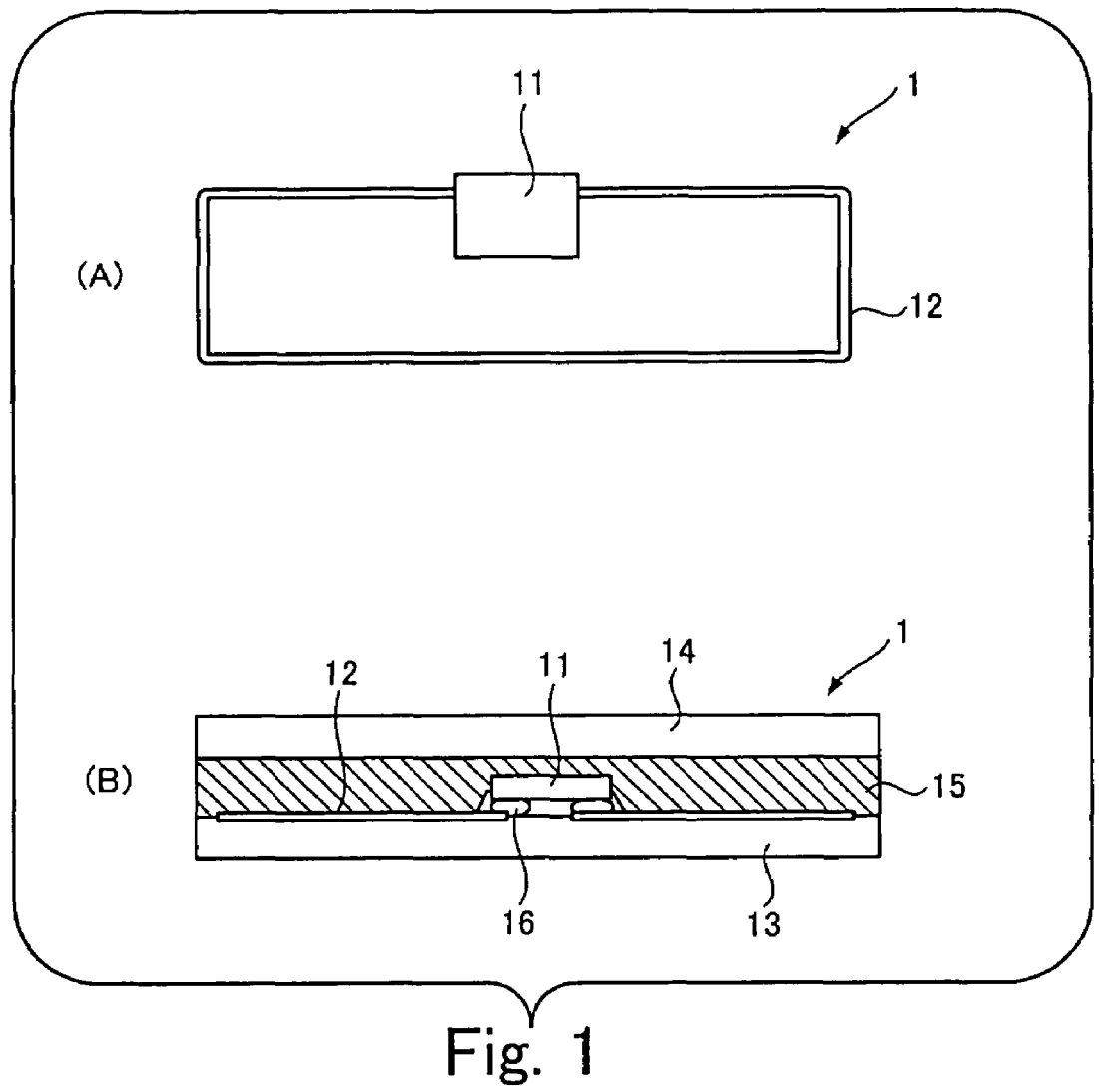
FIG. 1 is a front view (A) and a side view (B) showing an exemplary typical configuration of an RFID tag.
Figure 2:
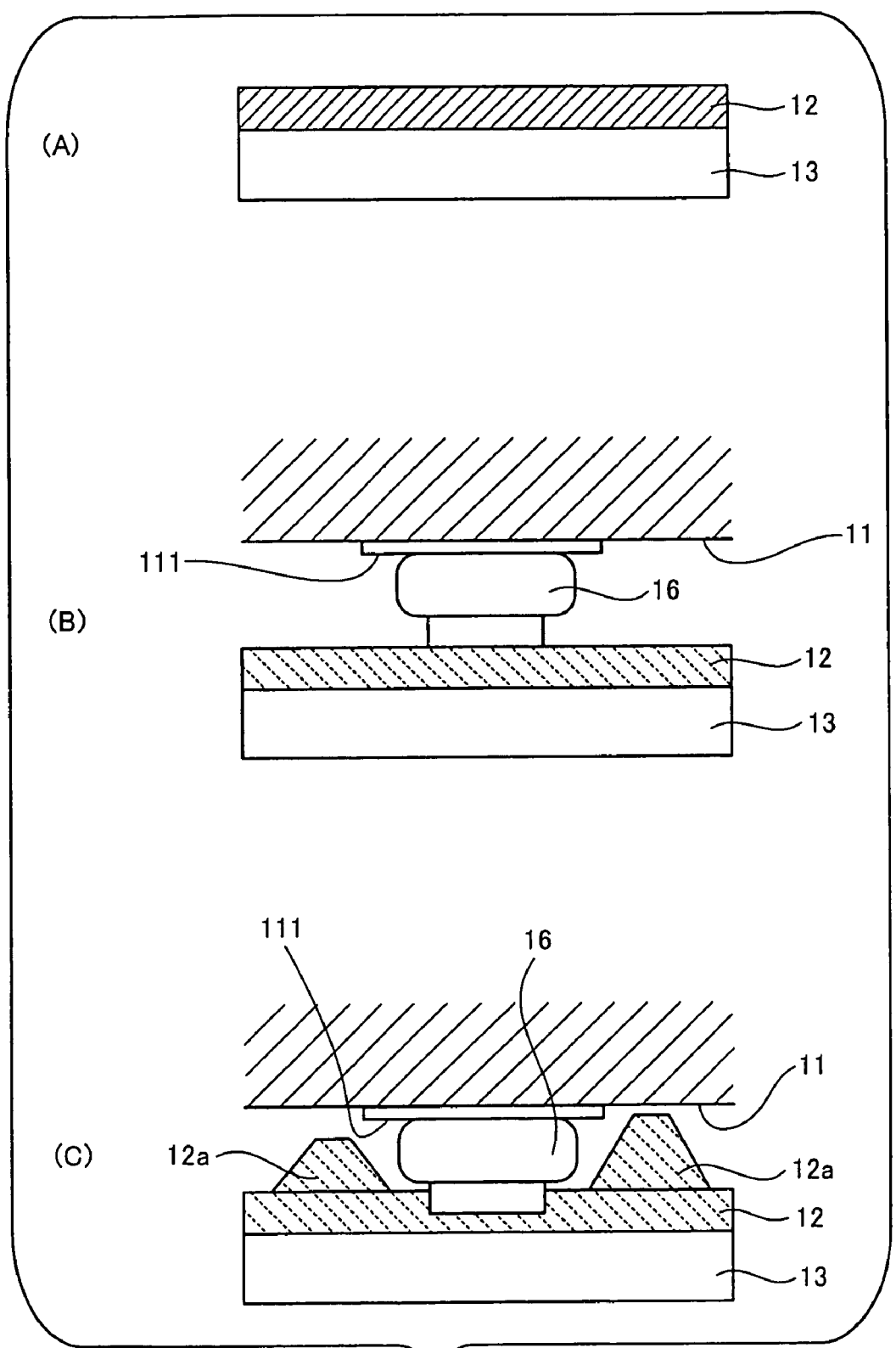
FIG. 2 is a conceptual diagram explaining the problem which arises when a paste is used as the antenna material.

The basic structure of an RFID tag 10 according to the present embodiment is similar to the exemplary typical structure shown in FIG. 1; the peripheral structure of IC chip alone is different from the exemplary structure. Therefore, only the peripheral structure of IC chip is shown in FIG. 3. Also, descriptions will be given below by focusing attention on the peripheral structure of IC chip.

The RFID tag 10 of the present embodiment includes: a first part having a base sheet 13 of PET material and an antenna pattern 12 formed of paste; and a second part having a sub base sheet 17 of PET material, a metallic patch 18, and an IC chip 11 connected onto the metallic patch 18 via a bump 16 disposed on an electrode 111.

Herein, the first part and second part constituting the RFID tag 10 correspond to an example of the first part (antenna component) and second part (module component) according to the present invention, respectively. The base sheet 13, antenna pattern 12, sub base sheet 17, metallic patch 18, and IC chip 11 correspond to an example of the first base, antenna, second base, metallic patch, and circuit chip according to the present invention, respectively.

With the present embodiment, the antenna pattern 12 is formed by use of a paste of resin material, such as epoxy, mixed with Ag filler. The metallic patch 18 is composed of a Cu thin film. The antenna pattern 12 of the first part and the metallic patch 18 of the second part are connected electrically to each other via a connecting wire 19 made of a paste similar to one constituting the antenna pattern 12.

Fabrication steps of this RFID tag 10 will be described below.

In the fabrication process of the RFID tag 10, firstly the IC chip 11 with the bump 16 is formed.

Figure 4:
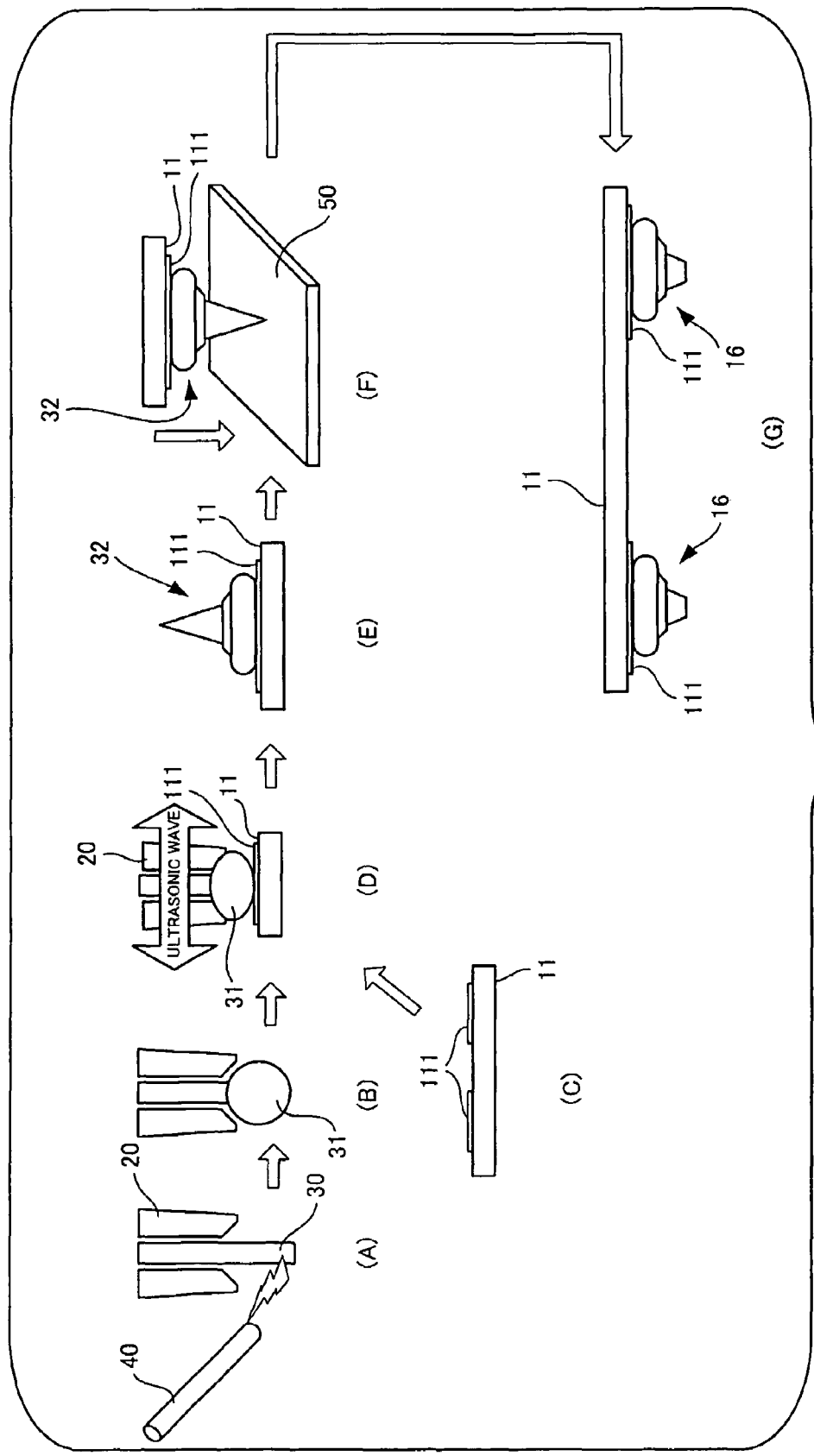
FIG. 4 is a view illustrating steps which form an IC chip with a bump.

FIG. 4 is a view illustrating steps which form the IC chip with the bump.

Firstly, as shown in step (A), a fine metallic wire 30 to be formed as a bump is caused to project from the tip end of a jig 20 with window, and electric discharge is made to occur between the fine metallic wire 30 and a discharge electrode 40. As a result, as shown in step (B), the tip end of the fine metallic wire 30 is melted by the discharge energy to form a metallic ball 31.

As shown in step (C), the IC chip 11 having formed therein an electrode 111 is prepared. Then, as shown in step (D), while pressing the metallic ball 31 against the electrode 111 of the IC chip 11, ultrasonic wave is applied to the metallic ball 31 via the jig 20. As a result, the metallic ball 31 is joined to the electrode 111 of the IC chip 11 by the ultrasonic wave; once the jig 20 is removed, the metallic ball 31 is separated from the end of the fine metallic wire 30, whereby a basic pattern 32 of bump is formed on the electrode 111 of the IC chip 11 as shown in step (E).

After the basic pattern 32 of bump is formed on the electrode 111 in this way, a leveling process is performed as shown in step (F) in which the basic pattern 32 of bump is pressed against the flat surface of a glass 50. As a result, as shown in step (G), the bump 16 having a uniform height is formed on the electrode 111 of the IC chip 11.

Once the IC chip 11 with the bump 16 is formed in this way, the fabrication process proceeds to the formation of the metallic patch of the second part.

Figure 5:
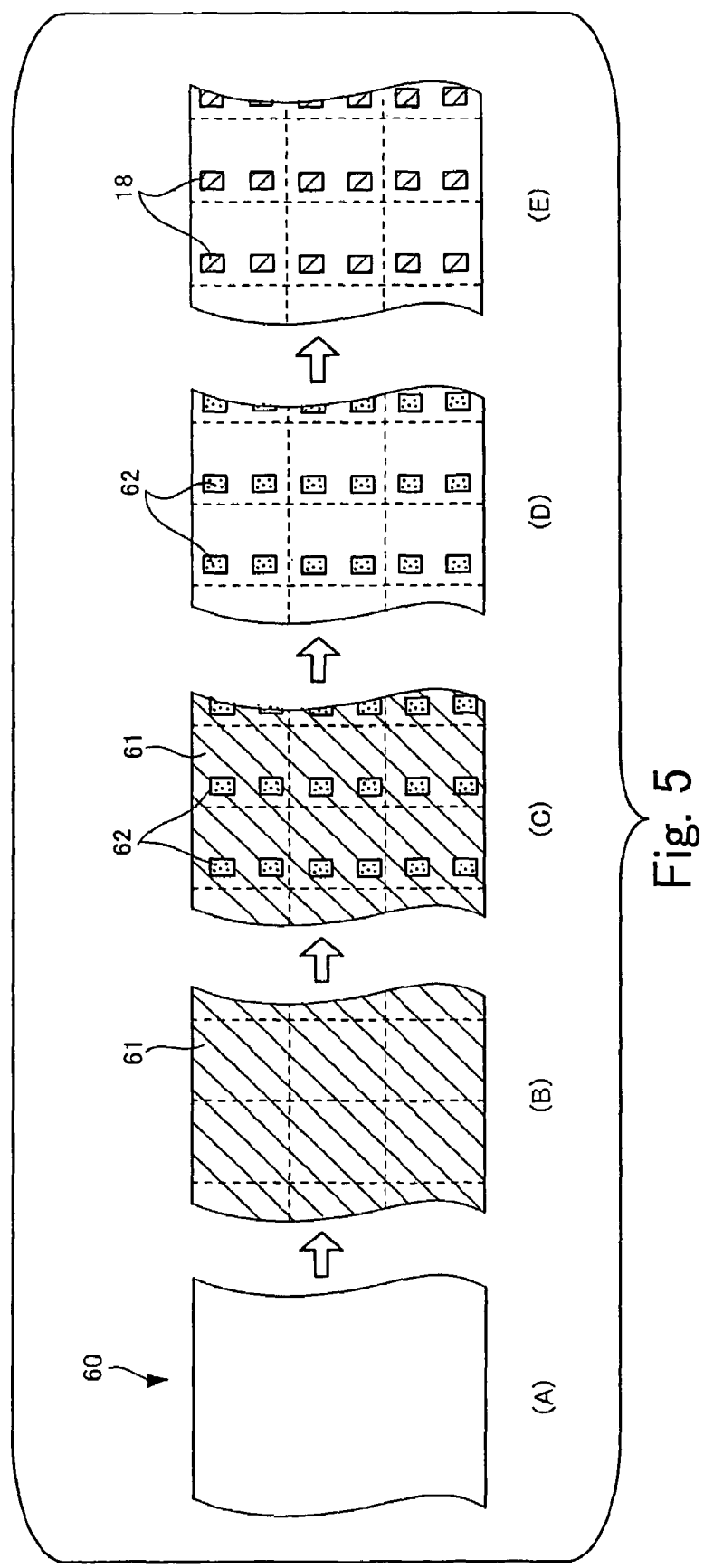
FIG. 5 is a view illustrating steps which form a metallic patch, with each of the steps being viewed from above.
Figure 6:
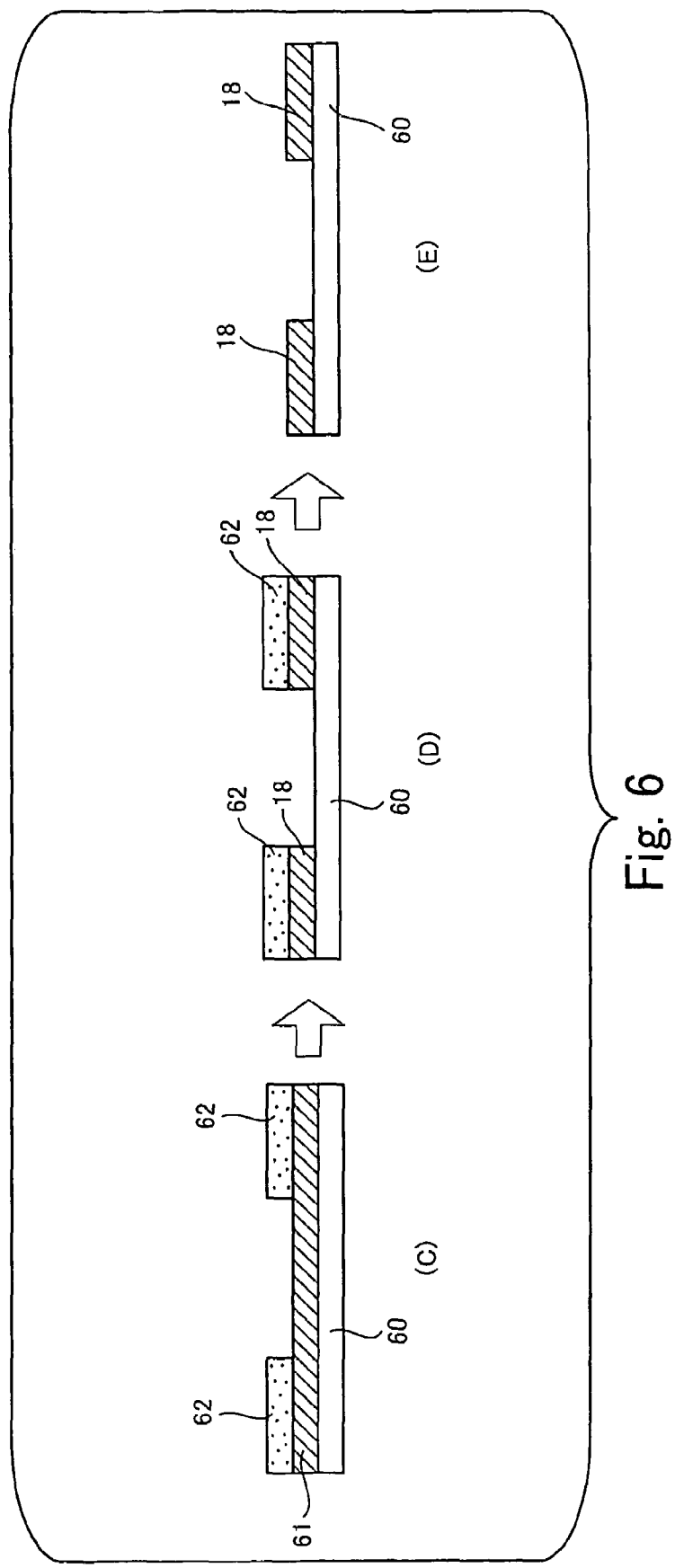
FIG. 6 is a view illustrating steps which form the metallic patch, with each of the steps being viewed from side.

FIGS. 5 and 6 are views illustrating steps which form the metallic patch; each of the steps are viewed from above in FIG. 5, and viewed from side in FIG. 6.

In forming the metallic patch, firstly a PET material 60 to be shaped into the sub base sheet of the second part is prepared as shown in step (A), and a thin film 61 of Cu is attached to the entire surface of the PET sheet 60 as shown in step (B). Then, a resist 62 having a position and shape identical to those of the metallic patch is formed on the thin film 61 of Cu as shown in step (C) of FIGS. 5 and 6, and unwanted part of the thin film 61 of Cu is removed by means of an etching process to form the metallic patch 18 as shown in step (D). Then, as shown in step (E), the resist 62 is removed so as to form the PET material 60 having the metallic patch 18 disposed in the proper position thereof.

In this way, the metallic patches 18 can be formed in a clustered manner on the PET material 60 corresponding to a group of sub base sheets; many metallic patches can be formed efficiently by a single etching process. This is possible because, with the RFID tag of the present embodiment composed of the first part and second part, the second part can be formed in a process separate from that of the first part.

After the formation of the metallic patch of the second part, in the fabrication steps of the RFID tag, the IC chip is mounted on the metallic patch.

Figure 7:
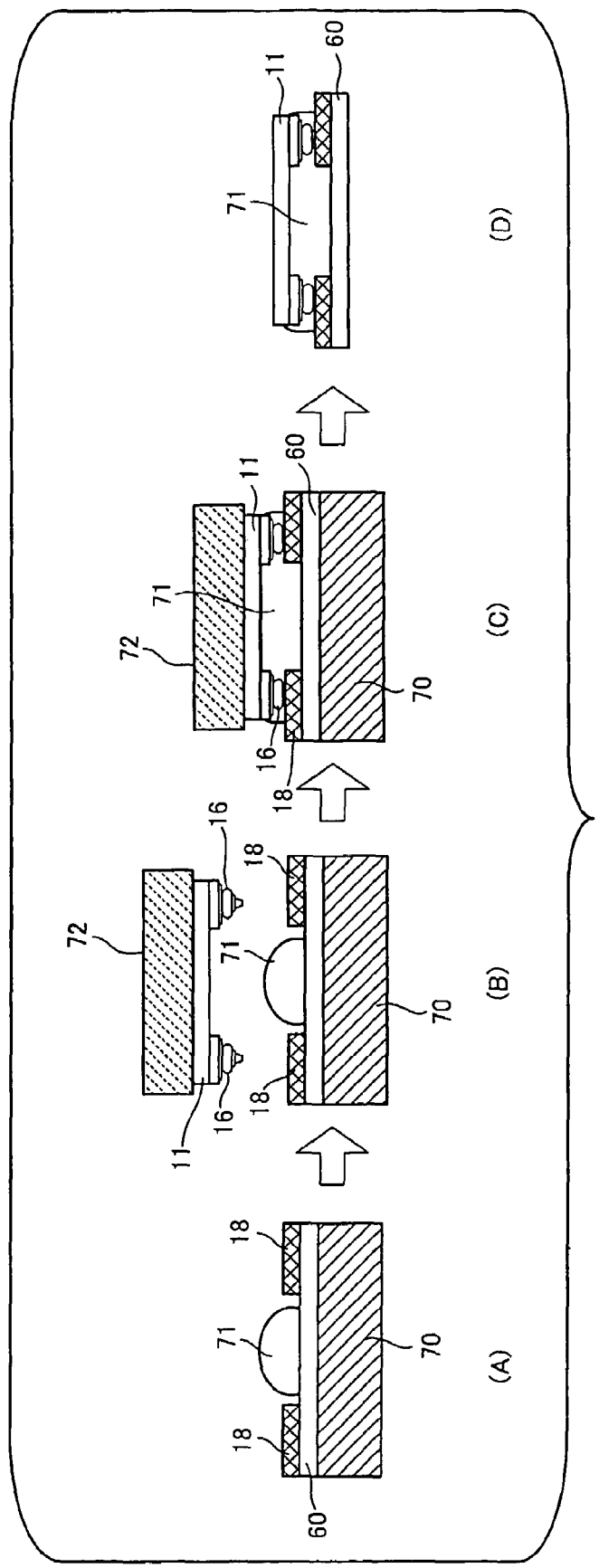
FIG. 7 is a view illustrating steps which mount the IC chip on the metallic patch.

FIG. 7 is a view illustrating steps which mount the IC chip on the metallic patch.

In mounting the IC chip, firstly the PET material 60 having the metallic patches 18 disposed in the prescribed position thereof is placed on a stage 70 as shown in step (A), and an adhesive 71 is applied between the metallic patches 18. Then, the IC chip 11 with the bump 16 is positioned properly relative to the metallic patch 18 by use of a mounting head 72 as shown in step (B), and the IC chip is pressed against the PET material 60 to connect the bump 16 to the metallic patch 18 as shown in step (C). In this case, the metallic patch 18 has enough strength to stand up to the pressure from the bump 16, whereby a sufficient insulating distance can be secured between the IC chip 11 and PET material 60. In addition, the adhesive 71 is heated by the stage 70 so as to be hardened. Consequently, as shown in step (D), the IC chip 11 is firmly fixed to the PET material 60 by the adhesive 71, whereby the structure corresponding to the second part of the RFID tag is obtained. The heating and hardening of the adhesive 71 may also be implemented by getting the PET material 60 through a high-temperature environment.

At the stage of step (D), the PET material 60 corresponds to multiple second parts connected to each other. Then, by cutting the PET material 60, individual second parts are formed.

Figure 8:
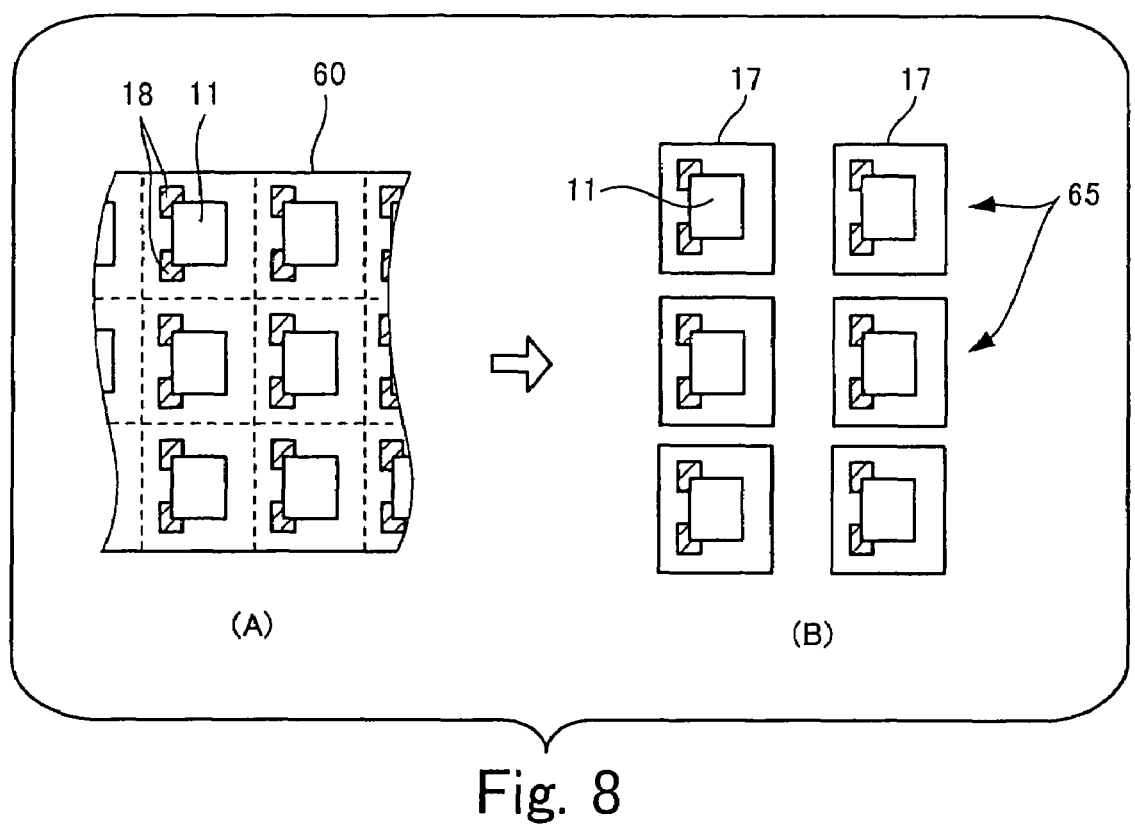
FIG. 8 is a view showing the process of cutting a second part.

FIG. 8 is a view showing the process of cutting the second part.

As shown in step (A), firmly attached onto the PET material 60 are multiple IC chips 11; a combination of one IC chip 11 and two metallic patches 18 corresponds to one second part of the RFID tag. By cutting the PET material 60 into sub base sheets 17 each having one IC ship 11 as shown in step (B), the second part is formed as the module component 65.

The steps of forming the module component 65 described in FIGS. 5 to 8 correspond to an example of the step of forming the second part in the RFID tag fabrication method according to the present invention; the module component 65 corresponds to an embodiment of the module component according to the present invention.

After the formation of the module component 65, the formation of the first part and the assembly of the RFID tag are performed in the RFID tag fabrication steps.

Figure 9:
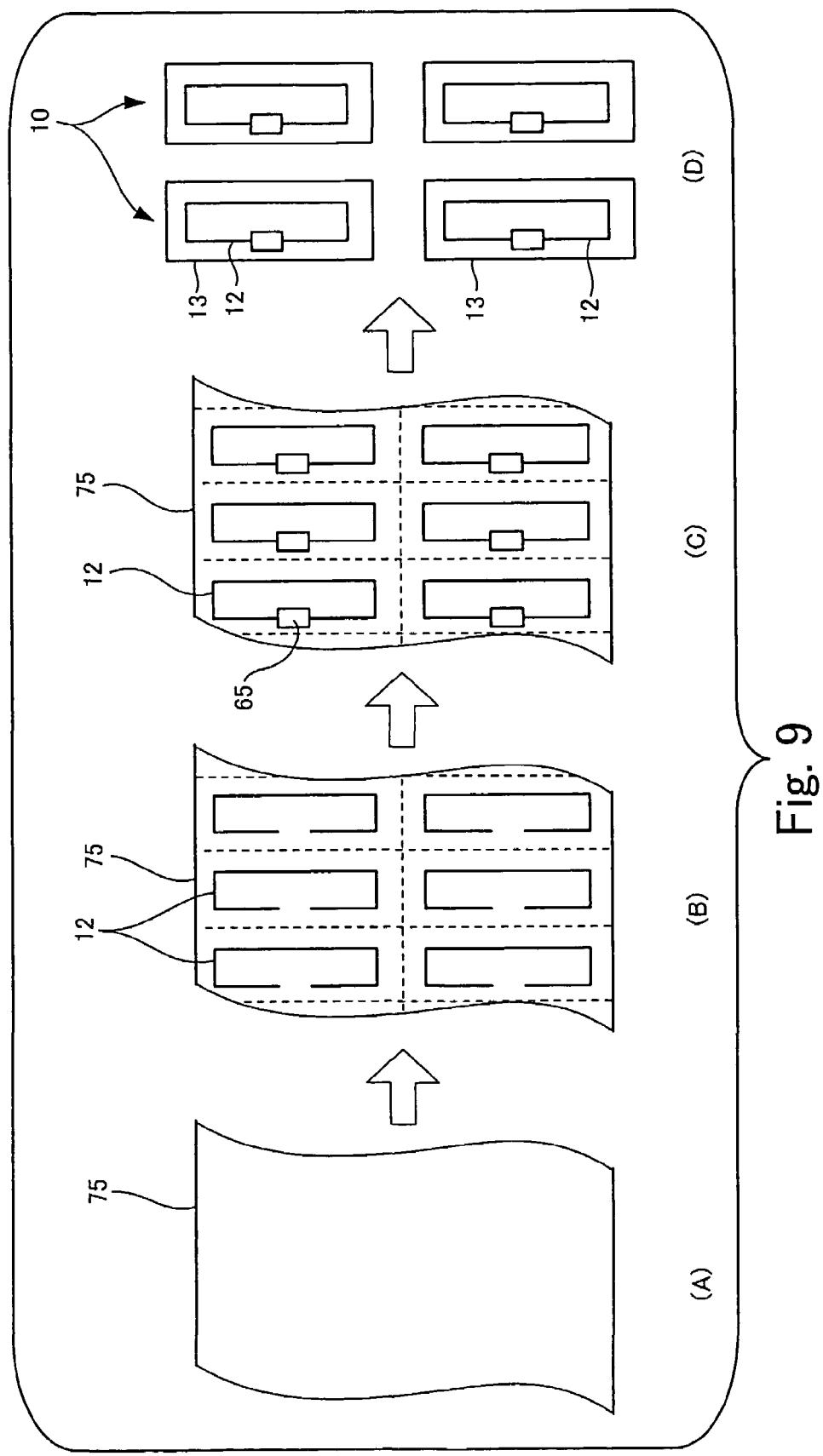
FIG. 9 is a view illustrating steps which form a first part and assembles the RFID tag.

FIG. 9 is a view illustrating steps which forms the first part and assembles the RFID tag.

In forming the first part, firstly a PET material 75 to be shaped into the base sheet of the first part of the RFID tag is prepared as shown in step (A), and then the antenna pattern 12 is printed and formed on the PET material 75 as shown in step (B). This step (B) corresponds to an example of the step of forming the first part in the RFID tag fabrication method according to the present invention.

Figure 10:
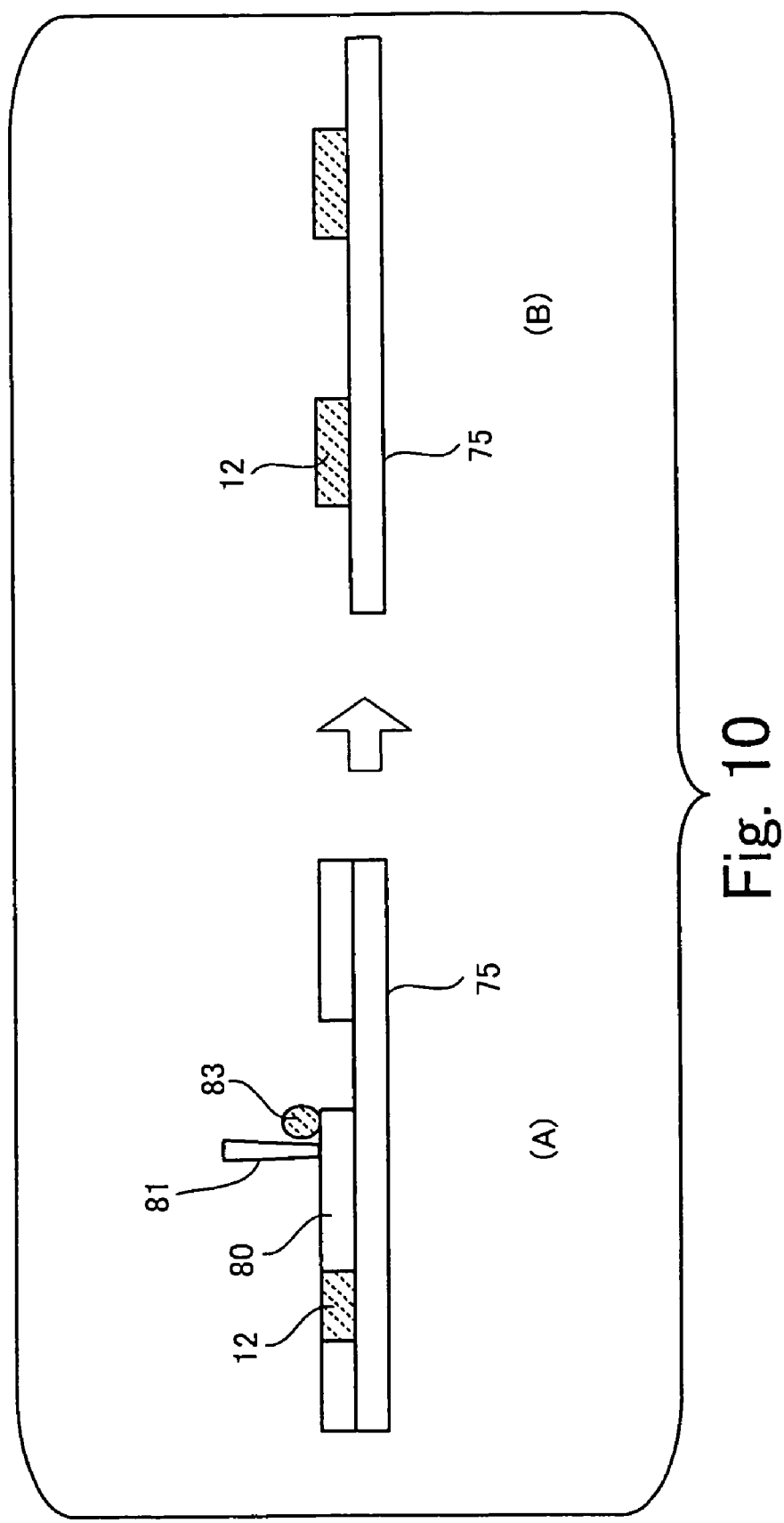
FIG. 10 is a view showing the details concerning the printing of an antenna pattern.

FIG. 10 is a view showing the details concerning the printing of the antenna pattern.

In printing the antenna pattern, as shown in step (A), a printing master 80 having a hole in the portion corresponding to the antenna pattern 12 is arranged on the PET material 75, and a paste 83 is printed by a squeegee 81 so as to fill the hole of the printing master 80.

Then, as shown in step (B), by removing the printing master 80 and dehydrating and hardening the rest, the antenna pattern 12 is formed on the PET material 75.

After the antenna pattern 12 is formed in step (B) of FIG. 9, the module component 65 is mounted on the PET material 75 as shown in step (C). This step (C) corresponds to an example of the step of disposing the second part on the first part to connect electrically the metallic patch on the second part to the antenna on the first part in the RFID tag fabrication method according to the present invention.

Figure 11:
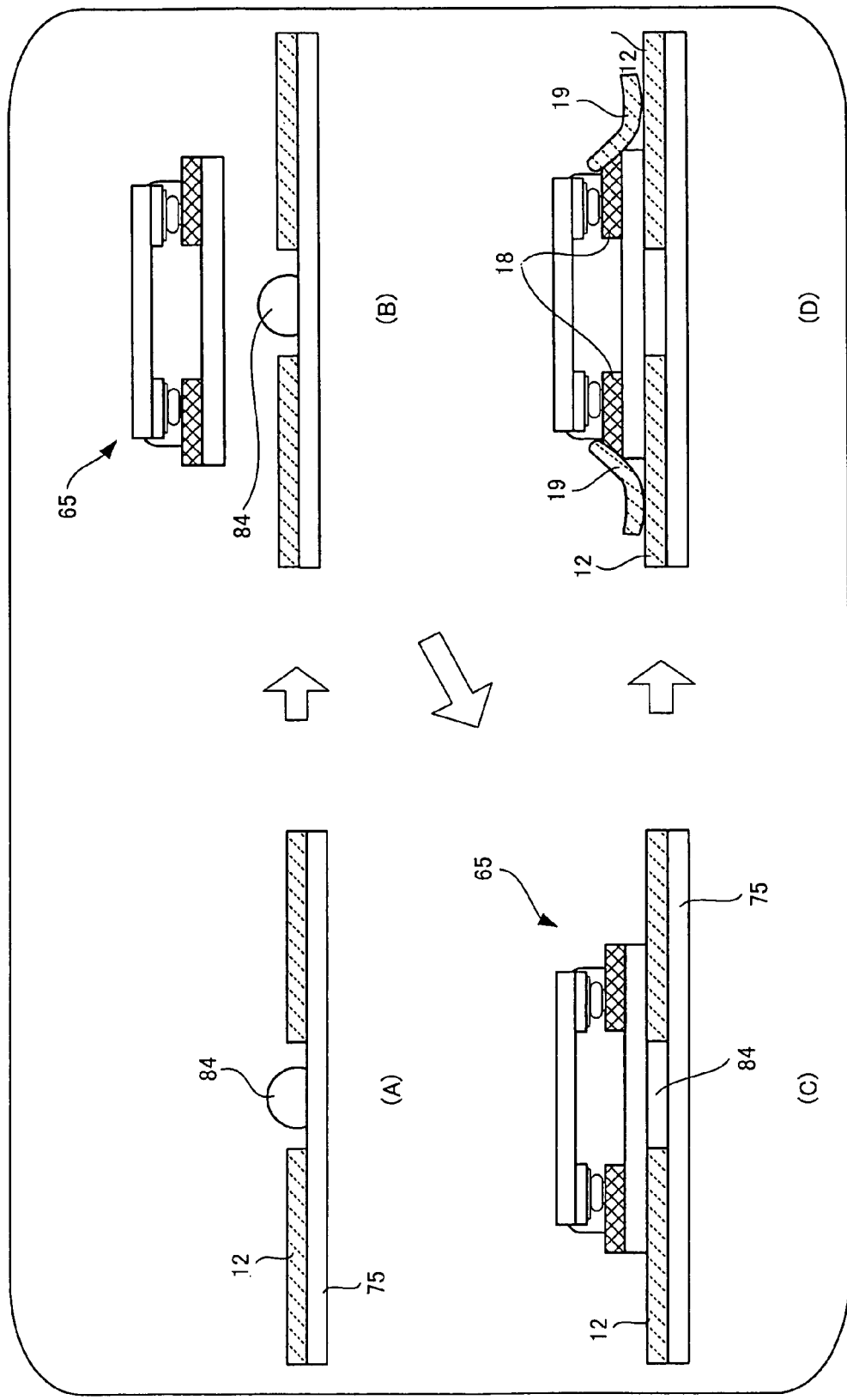
FIG. 11 is a view showing the details concerning the mounting of a module component.

FIG. 11 is a view showing the details concerning the mounting of the module component.

In mounting the module component, an adhesive 84 is applied to the mounting position on the PET material 75 having formed thereon the antenna pattern 12, as shown in step (A), and then the module component 65 is positioned as shown in step (B). Subsequently, as shown in step (C), the module component 65 is mounted on the antenna pattern 12, and the adhesive 84 is hardened by heating it from below. As a result, the module component 65 is firmly attached to the PET material 75. Then, as shown in step (D), a connecting wire 19 is printed by use of a paste material between the metallic patch 18 on the module component 65 and the antenna pattern 12 on the PET material 75 to connect electrically the metallic patch 18 to the antenna pattern 12.

After the module component 65 is mounted in this way in step (C) of FIG. 9, a cover sheet is applied and attached to the whole PET material 75 (not shown), and then by cutting the PET material 75 as shown in step (D), the base sheet 13 is formed, whereby the RFID tag 10 is finished.

In the above description, the antenna pattern made of an Ag paste is shown as an exemplary antenna according to the present invention. The antenna according to the present invention, however, may be made of a paste mixed with metallic filler other than Ag.

Also, in the above description, the metallic patch made of a Cu thin film is shown as an exemplary metallic patch according to the present invention. The metallic patch according to the present invention, however, may be one made of Al, Au or the like.

Also, in the above description, the base sheet made of a PET material is shown as an exemplary first base and second base according to the present invention. The first base and second base according to the present invention, however, may be made of a material other than PET.

What is claimed is:

1. An RFID tag comprising:
a first part which has a first base and a communication antenna formed on the first base by use of a paste of resin material mixed with metallic filler; and
a second part disposed on the first part, which has a second base, a metallic patch disposed on the second base and electrically connected to the antenna on the first part, and a circuit chip connected onto the metallic patch via a bump such that the bump is beneath the circuit chip and sandwiched between the circuit chip and the metallic patch, the circuit chip performing radio communication via the antenna.

2. The RFID tag according to claim 1, wherein in the second part, the metallic patch is connected to the antenna of the first part via a paste of resin material mixed with metallic filler.

3. A module component which constitutes an RFID, mounted on an antenna component which has a first base and a communication antenna formed on the first base by use of a paste of resin material mixed with metallic filler, the module component comprising:
a second base;
a metallic patch disposed on the second base to be electrically connected to the antenna on the antenna component; and
a circuit chip connected onto the metallic patch via a bump such that the bump is beneath the circuit chip and sandwiched between the circuit and metallic the chip performing radio communication via the antenna.

4. An RFID tag fabrication method which fabricates an RFID tag including a communication antenna and a circuit chip performing radio communication via the antenna, the RFID tag fabrication method comprising the steps of:
forming a first part by disposing the antenna on a first base by use of a paste of resin material mixed with metallic filler;
forming a second part by disposing a metallic patch on a second base and connecting the circuit chip onto the metallic patch via a bump such that the bump is beneath the circuit chip and sandwiched between the circuit chip and the metallic patch; and
disposing the second part on the first part to connect electrically the metallic patch on the second part to the antenna on the first part.

5. The RFID tag fabrication method according to claim 4, wherein in the step of forming the second part, the second part is formed by disposing the metallic patch on a base material having a width corresponding to a plurality of pieces of the second base, connecting the circuit chip onto the metallic patch via the bump such that the bump is sandwiched between the circuit chip and the metallic patch, and then cutting the base material into a plurality of pieces of the second base.

* * * * *